United States Patent [19]
Lee et al.

[11] Patent Number: 5,810,935
[45] Date of Patent: Sep. 22, 1998

[54] APPARATUS FOR TRANSFERRING A WAFER

[75] Inventors: Jong-Hyun Lee; Hyung-Joun Yoo; Boo-Yeon Choi; Won-Ick Jang; Ki-Ho Jang, all of Daejeon, Rep. of Korea

[73] Assignee: Electronics and Telecommunications Research Institute, Daejeon, Rep. of Korea

[21] Appl. No.: 564,575

[22] Filed: Nov. 29, 1995

[30] Foreign Application Priority Data

Dec. 6, 1994 [KR] Rep. of Korea ........................ 94-32936

[51] Int. Cl.⁶ .......................... C23C 16/00; B65G 49/07
[52] U.S. Cl. ........................... 118/728; 414/936; 414/937; 414/939; 414/941; 901/30; 901/39; 118/500; 156/345
[58] Field of Search ...................... 118/728, 500; 156/345; 414/936, 937, 939, 941; 294/86.4, 106; 901/30, 33, 38, 39

[56] References Cited

U.S. PATENT DOCUMENTS

| | | | |
|---|---|---|---|
| 3,630,391 | 12/1971 | Wilson | 214/1 BB |
| 3,633,537 | 1/1972 | Howe | 118/500 |
| 3,945,676 | 3/1976 | Asamoto | 294/88 |
| 4,410,209 | 10/1983 | Trapani | 414/941 |
| 4,584,045 | 4/1986 | Richards | 414/939 |
| 4,715,637 | 12/1987 | Hosoda | 414/941 |
| 4,717,190 | 1/1988 | Witherspoon | 414/941 |
| 4,795,299 | 1/1989 | Boys | 414/939 |
| 4,875,824 | 10/1989 | Moe | 414/941 |
| 4,951,601 | 8/1990 | Maydan et al. | 118/719 |
| 4,971,512 | 11/1990 | Lee et al. | 414/744.8 |
| 4,986,216 | 1/1991 | Ohmori | 118/730 |
| 4,989,544 | 2/1991 | Yoshikawa | 118/723 |
| 5,133,635 | 7/1992 | Malin | 414/941 |
| 5,186,756 | 2/1993 | Benko | 118/715 |
| 5,192,370 | 3/1993 | Oda | 118/715 |

FOREIGN PATENT DOCUMENTS

| | | | |
|---|---|---|---|
| 0402229 A1 | 12/1990 | European Pat. Off. | 901/33 |
| 258768 A1 | 8/1988 | German Dem. Rep. | 901/39 |
| 5-55342 | 3/1993 | Japan | 414/941 |
| 2265511 | 9/1993 | United Kingdom . | |
| WO92/05920 | 4/1992 | WIPO . | |
| WO 94/19821 | 9/1994 | WIPO | 414/941 |

OTHER PUBLICATIONS

New Challenges for Robotics and Automation, Solid State Technology pp. 67–69, Apr. 1994.

*Primary Examiner*—R. Bruce Breneman
*Assistant Examiner*—Jeffrie R. Lund
*Attorney, Agent, or Firm*—Jacobson, Price, Holman & Stern, PLLC

[57] ABSTRACT

An apparatus for transferring a wafer in a semiconductor manufacturing process, and for carrying a wafer between a cassette and a wafer chuck without an additional tool such as a tripod. The apparatus includes: a holder capable of holding the side of the wafer; a wafer transfer assembly including an actuator of the holder and a detector that detects a malfunction of the holder; and a process reactor having a vacuum exhaust port installed under a wafer chuck so as to guide gas in an axially-symmetric flow pattern. The holder grasps the rounded side of a wafer. Removal of additional tools makes the structure of an overall system more simple and an exhaust port can be installed under the reactor so as to cause processing gas to be guided in an axially-symmetric flow, resulting in an enhancement of the process uniformity.

15 Claims, 9 Drawing Sheets

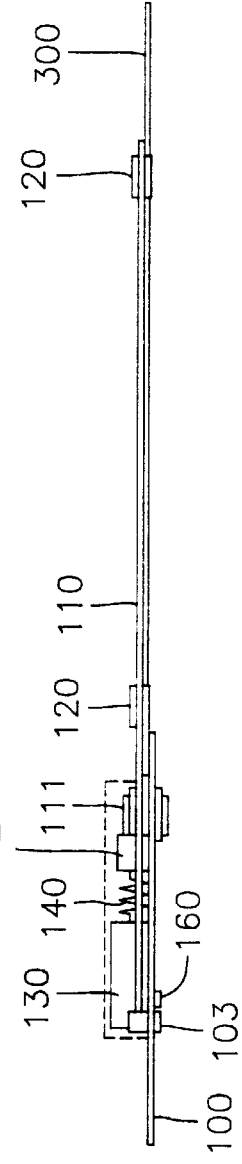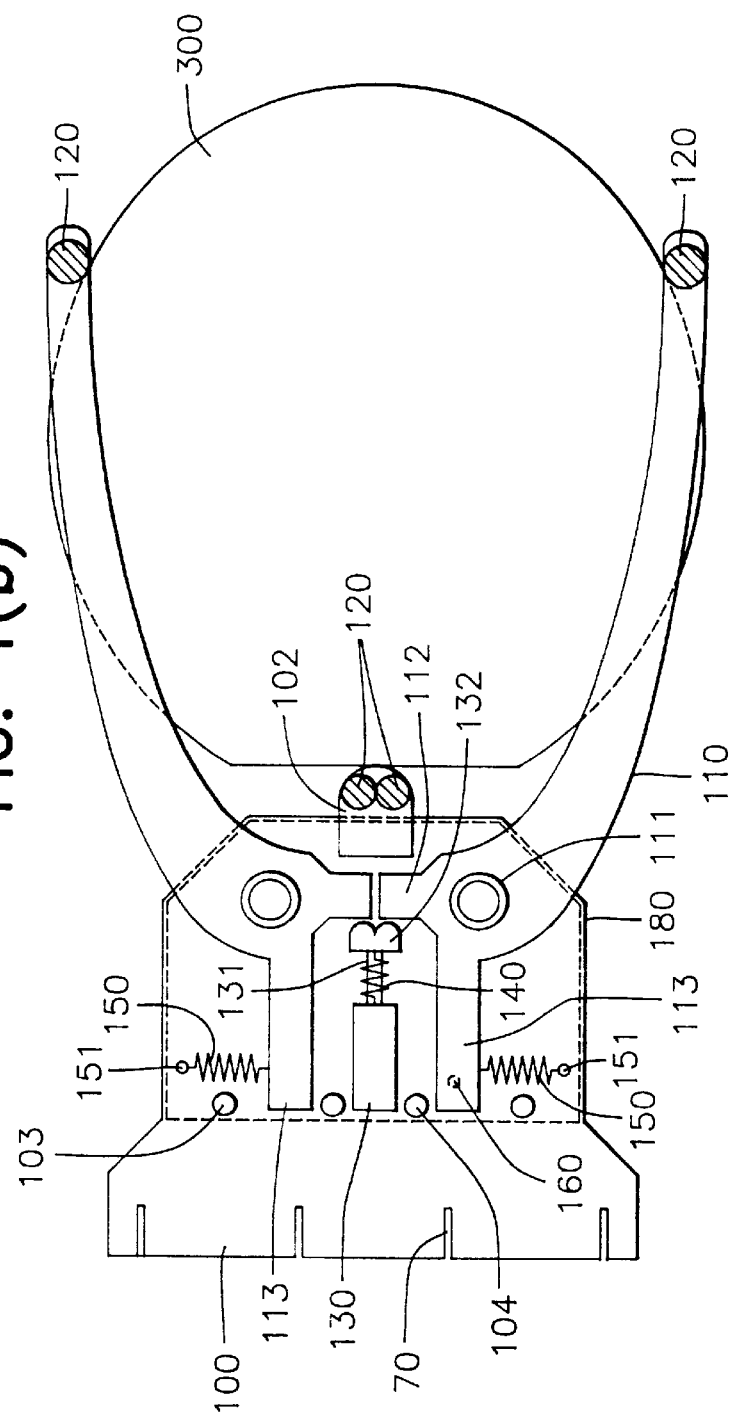

125um < R < t/2
75um < d < t

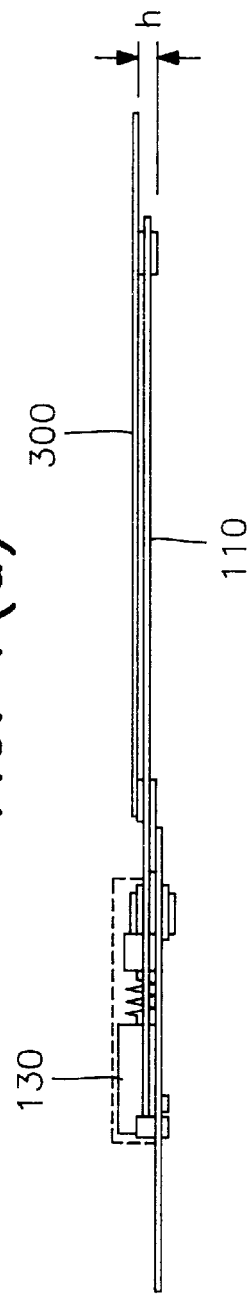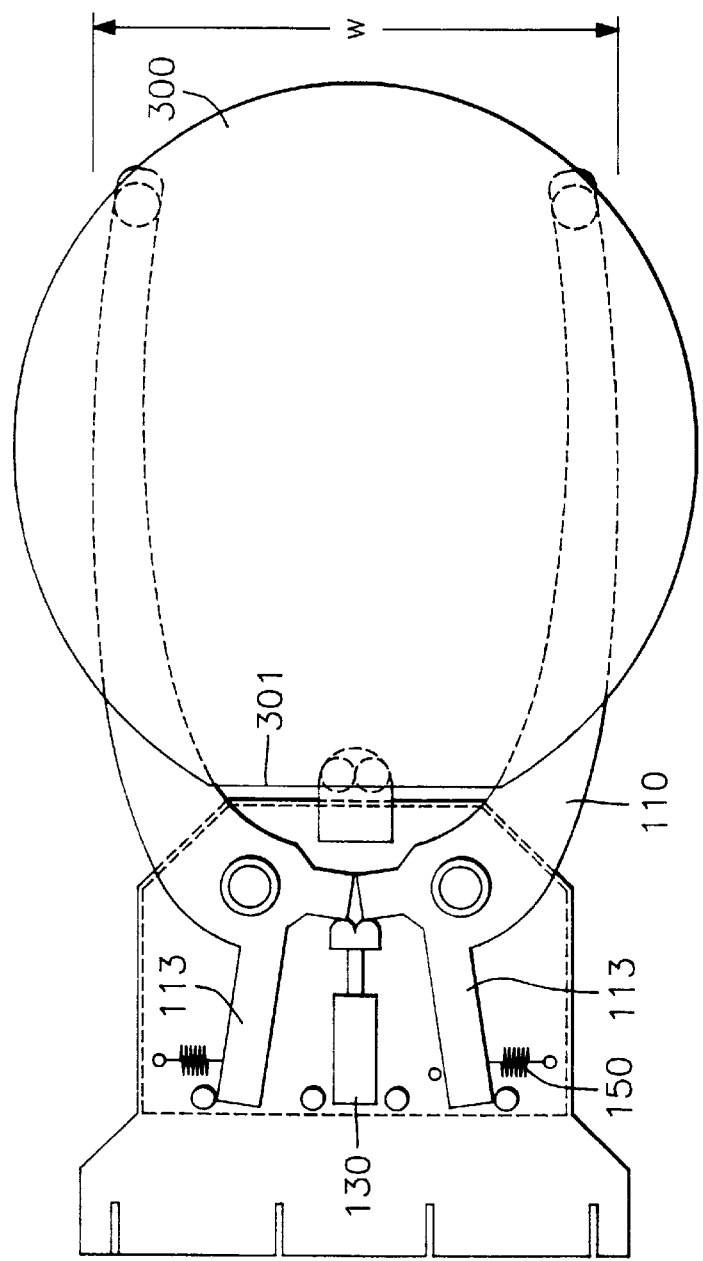

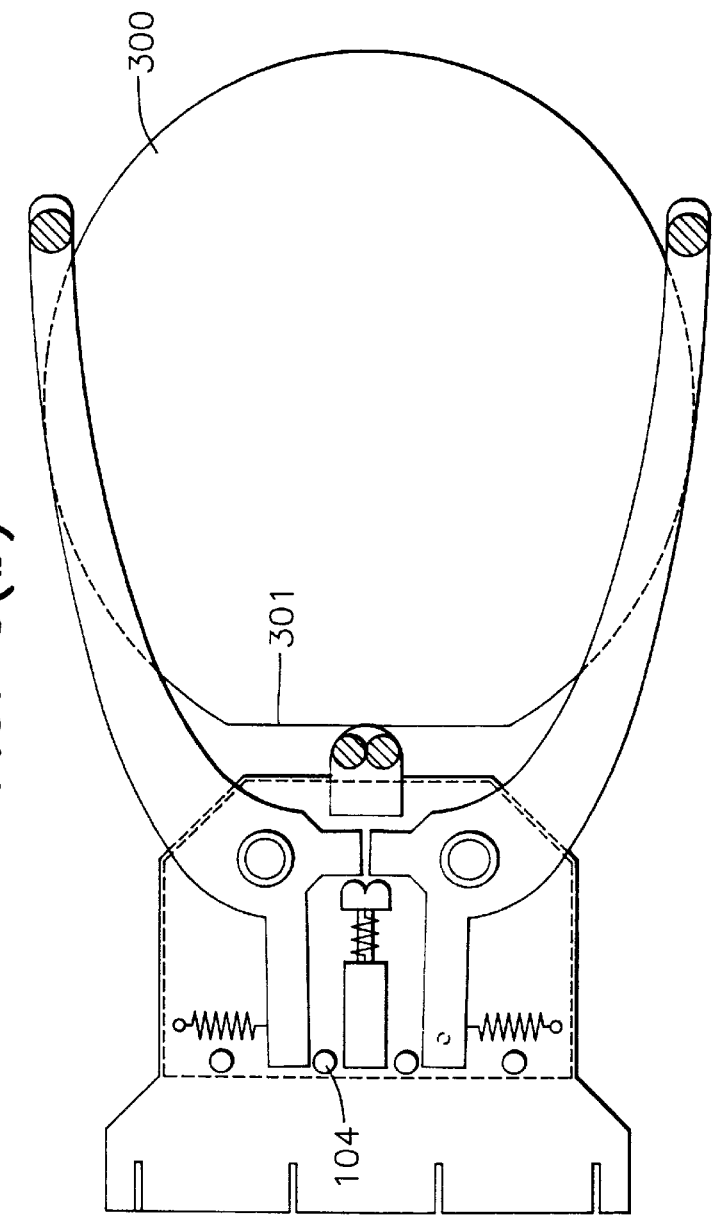
FIG. 8(a)
FIG. 8(b)

APPARATUS FOR TRANSFERRING A WAFER

BACKGROUND OF THE INVENTION

1. Field of the Invention

The present invention relates to an apparatus for manufacturing semiconductor devices, and more particularly to an apparatus for transferring a wafer, in which the wafer can be easily engaged against a wafer chuck by means of a holder safely catching rounded edges of the wafer without the help of a tripod.

2. Description of the Prior Art

While it is well known that manufacturing processes for semiconductor devices are conducted under vacuum conditions, the recent trend is to use the cluster tools as shown in FIG. 9 in an efficient manner.

An often used process includes, in general, a process reactor, a wafer carrying apparatus and vacuum system, as shown in FIG. 10. Referring to FIG. 10, tripod 4, tripod driver 7 and bellows 6 are installed under wafer chuck 3, tripod driver 7 and bellows 6 being for actuating tripod 4. Vacuum exhaust port 11 and vacuum pump 12 are installed on the side of a body, and O-shaped ring 5 is provided to seal up an opening between wafer chuck 3 and tripod 4. On the other side of the body, a gate valve 9 is installed and the wafer 1 is carried by holder 2. Reference numbers 8 and 10 in FIG. 10 denote a chamber wall and a gas shower, respectively.

In the operation of the wafer transfer apparatus using the conventional module, a wafer 1 held by a holder 2 in an orientation corresponding to a process position, is put into a preselected process reactor just after, as shown in FIG. 11, an alignment adjuster fits the wafer 1 in the orientation which corresponds to the processing position. Either a flat-type holder 2 of FIG. 11A or a U-shaped holder 2 may be used. Reference number 13 denotes a wafer contact tip. Therefore, to receive wafer 1 in the process reactor, a transfer sequence is required such that, after a tripod 4 moves up to lift wafer 1 as shown in FIG. 12b in the center space of the process reactor, (wafer 1 being held by holder 2 as shown in FIG. 12a), holder 2 moves back as shown in FIG. 12c and then wafer 1 is mounted on wafer chuck 3 as a result of the tripod's descent or retraction as shown in FIG. 12d.

However, the conventional module requires additional components for actuating tripod 4 in up-and-down motion, such as a driver 7 and a bellows 6, which are attached to the bottom of the process reactor. Further disadvantages of the conventional module include a negative influence on the vacuum exhaust current speed and the process uniformity because vacuum exhaust port 11 is installed on the side of the reactor body. In addition, the leakage near the O-shaped ring 5 used for a seal material between the reactor and tripod 4 also reduces the process reliability.

SUMMARY OF THE INVENTION

It is therefore an object of the invention to provide an improved apparatus for transferring a wafer which ensures uniformity of the vacuum exhaust current and process conditions, and enhances process reliability.

In order to achieve these objects, the apparatus in accordance with the present invention includes holding means capable of holding rounded edges of the wafer, wafer transfer means including means for actuating said holding means and means for detecting a malfunction of said holding means, and a process reactor having a vacuum exhaust port installed under a wafer cassette so as to guide process gas flow in an axially-symmetric flow pattern. The holding means holds the rounded edges of a wafer. Removal of additional tools makes the structure of the overall system simpler, and the position of the exhaust port under the reactor so as to guide processing gas in an axially-symmetric flow pattern results in enhancement of the process uniformity.

BRIEF DESCRIPTION OF THE DRAWINGS

Figs. 1a and 1b show side and plan views, respectively, of a wafer holder in accordance with the present invention.

FIGS. 7a and 7b are schematic diagrams for illustrating the position of the forefingers while the wafer is being lifted out of a cassette by the wafer holder.

FIGS. 8a and 8b are schematic diagrams illustrating the position of the forefingers when a wafer holder of the present invention places a wafer.

DETAILED DESCRIPTION OF THE PREFERRED EMBODIMENTS

Preferred aspects of the present invention are discussed in turn, accompanying the appended drawings.

FIGS. 1a and 1b show detailed side and top views of the wafer holder in accordance with the present invention. Referring to FIGS. 1a–1b, the present wafer holder includes holding means for holding rounded edges of wafer 300, an actuating means for operating the holding means and a detecting means for detecting mal-functions during operation of the holding means.

Figure 9:
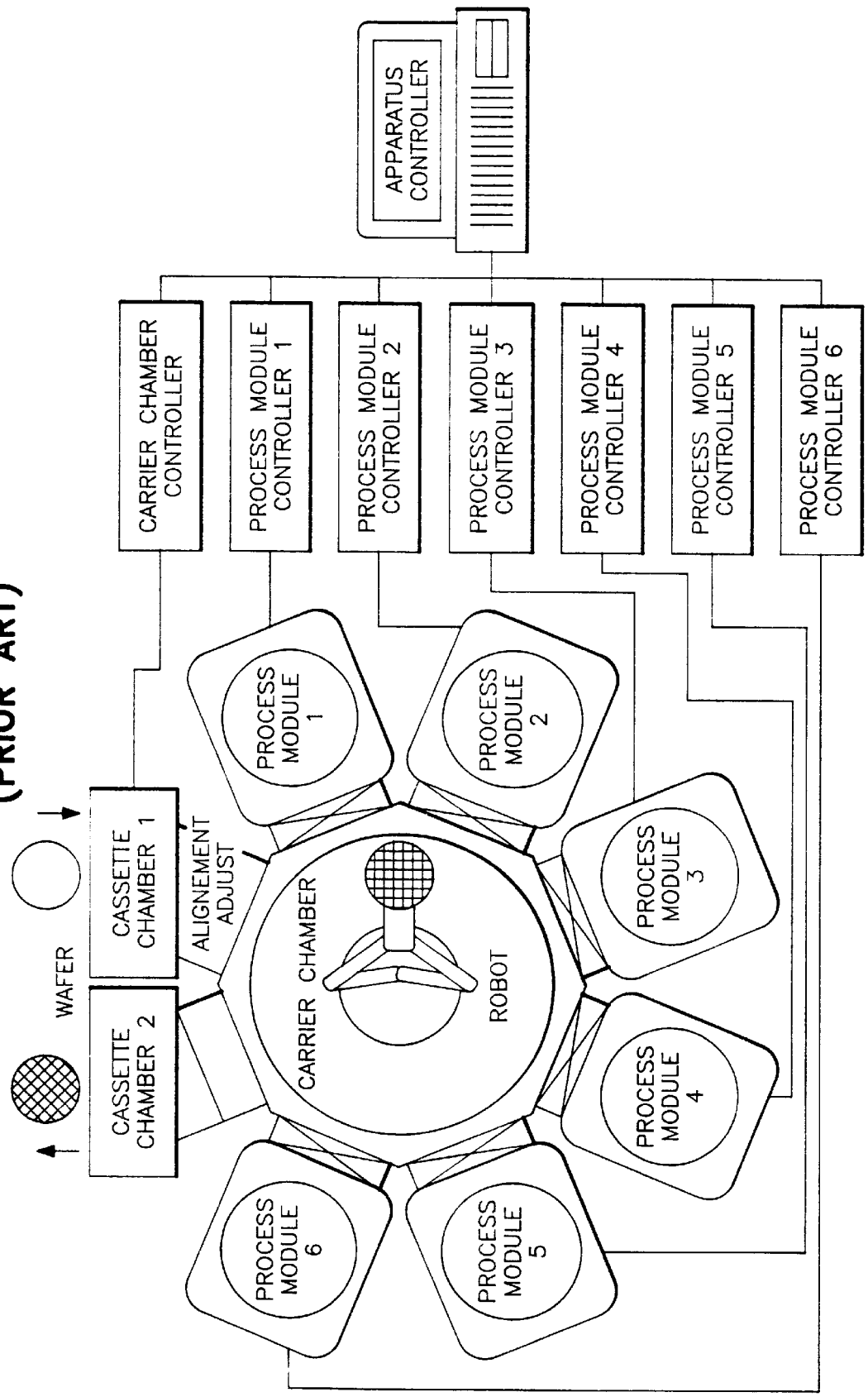
FIG. 9 is a diagram illustrating an integrated apparatus for manufacturing a semiconductor.
Figure 10:
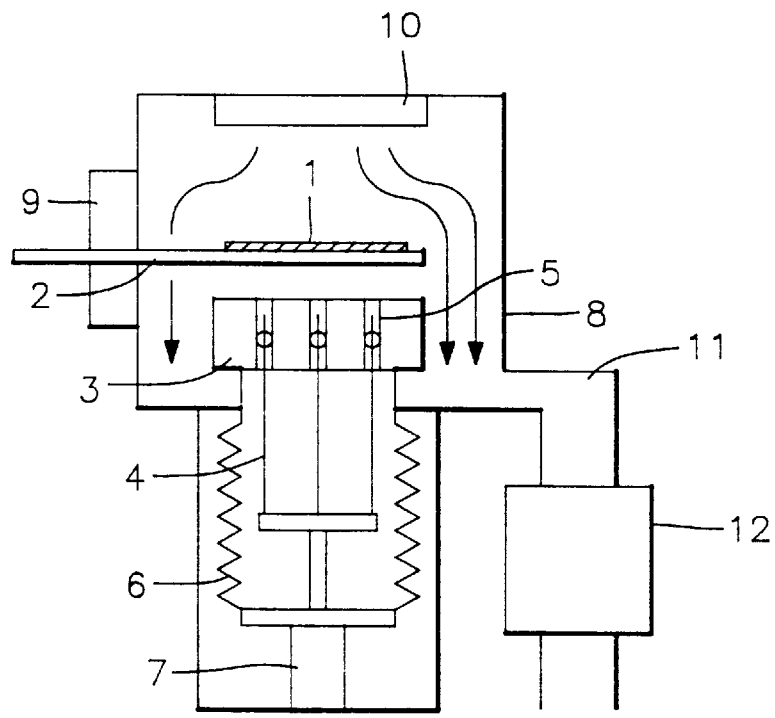
FIG. 10 illustrates a conventional process module.
Figure 11A:
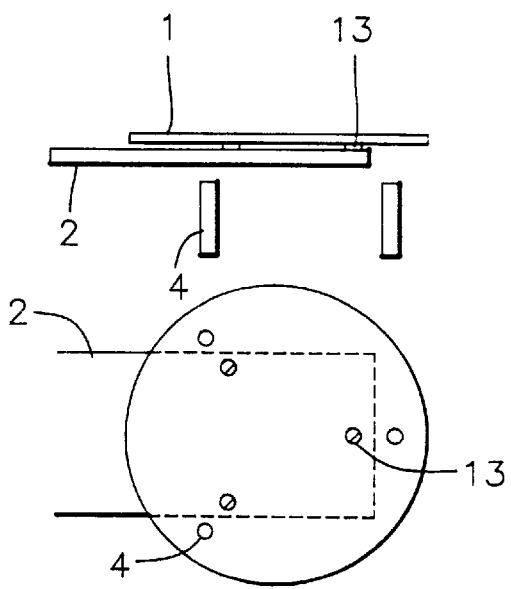
FIGS. 11a and 11b are schematic diagrams illustrating the shape of a conventional wafer holder.
Figure 11B:
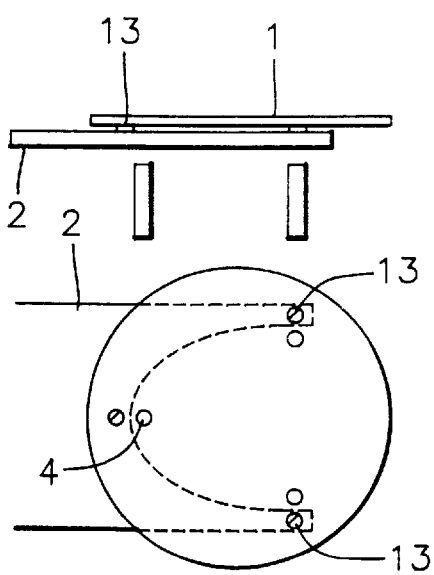
Figure 12A:
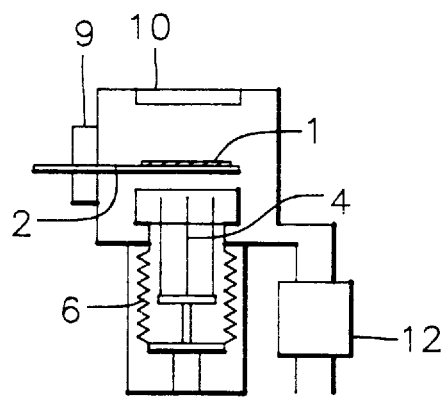
FIGS. 12a–12b are schematic diagrams illustrating the sequential steps in the process of loading and unloading using a conventional wafer holder.
Figure 12B:
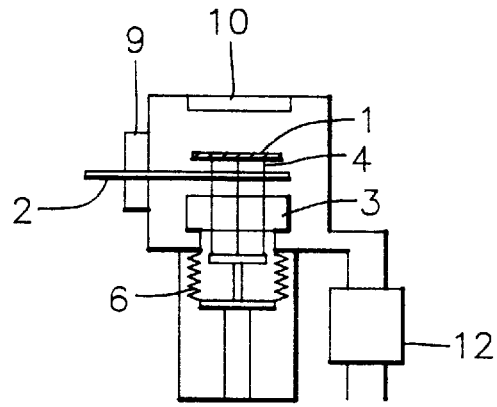
Figure 12C:
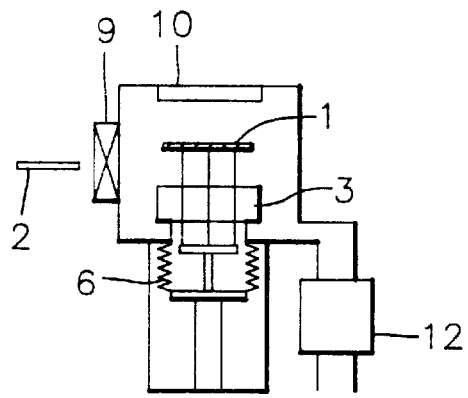
Figure 12D:
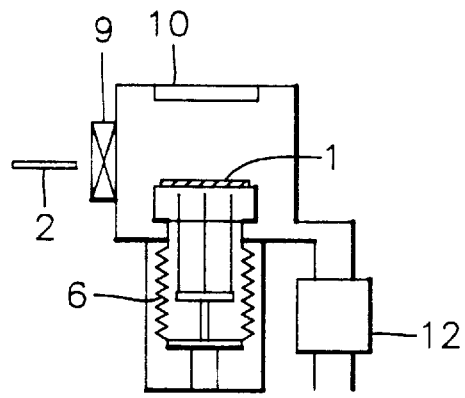

The actuating means includes a holder driver 130, a holder driving mover 132 which can operate in a rectilinear motion by load 131 of holder driver 130, a compression spring 140 inserted into load 131 and a tension spring 150 connected to both sides of an operating lever 113 of a forefinger 110. A tension spring 150 is fixed in both ends of support 100 by spring fixing pins 151. A folded top plate 180 is employed to prevent particle generation from the apparatus. A slot 170 can be used to connect the apparatus with the robot shown in FIG. 9. The holder driving mover 132 of the actuating means is installed for the purpose of pushing operating hook 112 attached to the inner side of forefinger 110, so that forefinger 110 can rotate around roller bearing 111. Holder driver 130 of the actuating means preferably consists of a solenoid.

The holding means includes a forefinger 110 which can be opened or pursed by the actuating means, and wafer contact tips 120 disposed at both ends of forefinger 110 and at a center tip support pad 102. On the underside of contact tips 120, as shown in FIG. 3, rounded recesses 121 are formed to tightly hold the sides of wafer 300.

Figure 4A:
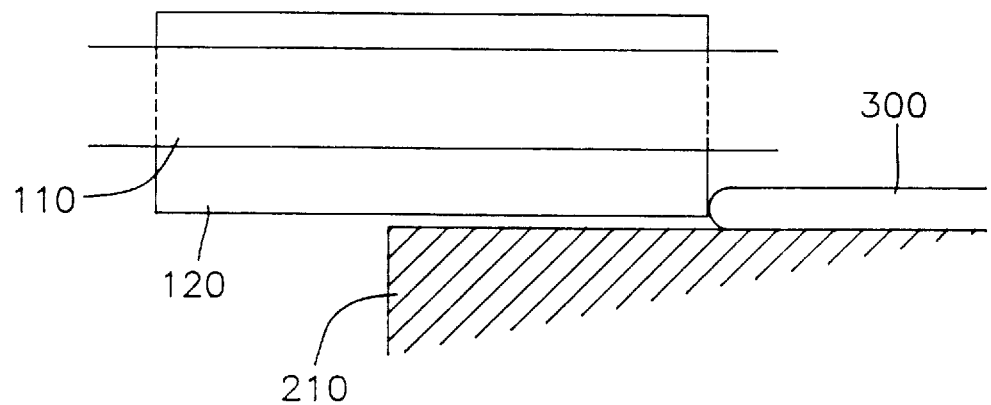
FIG. 4a and 4b are schematic diagrams illustrating alternative embodiments of the wafer holder of the present invention employing frictional engagement and a holding jaw, respectively.

In another embodiment, the wafer contact tips 120 are installed at the central tip support pad 102, such as of the rectangular-type. This embodiment has the advantage of an automatic alignment of wafer 300 having a straight flat surface 301 on its side, the alignment being accomplished simultaneously with the wafer holding operation. In still another embodiment two wafer contact tips 120 on the central tip support pad 102 are available. In yet another embodiment, as shown in FIG. 4, holder jaw 122 is formed at the lower or bottom edge portion of wafer contact tip 120 in order to engage or hold an outer underside portion of wafer 300.

Figure 2:
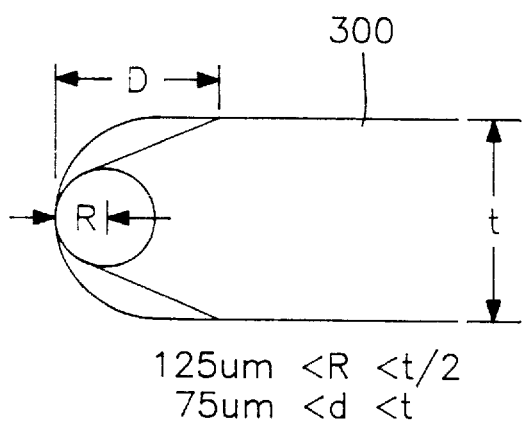
FIG. 2 is a side view of a silicon wafer.
Figure 3A:
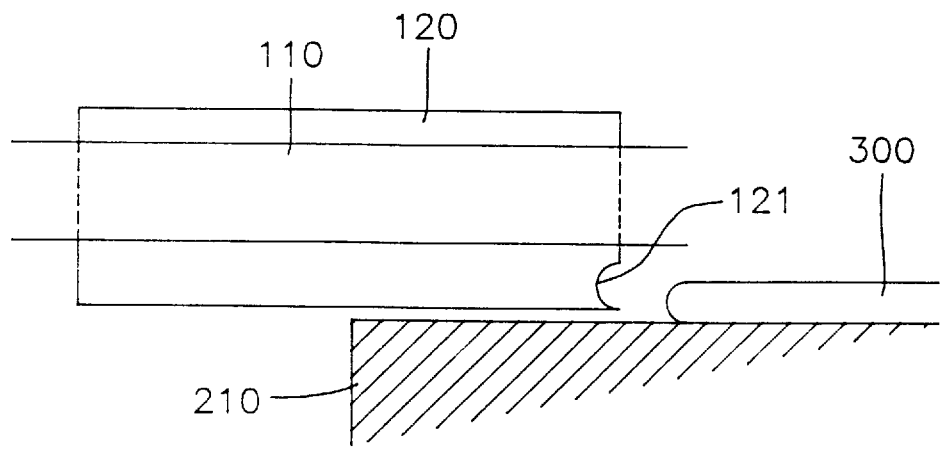
FIGS. 3a and 3b are schematic diagrams illustrating how a wafer is removed from the cassette using the wafer holder of the present invention.
Figure 3B:
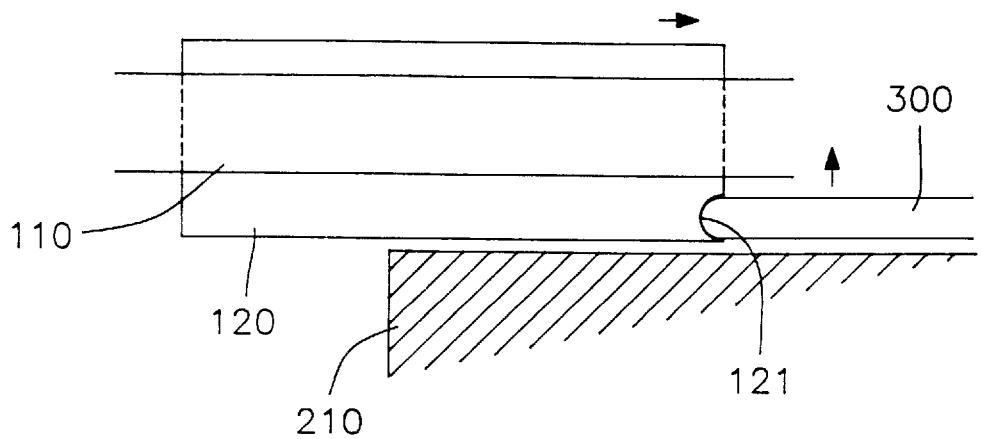

The mechanism for holding the wafer 300 is perhaps best seen in FIGS. 3(a) and 3(b). The contact tip 120 with rounded recesses 121 horizontally approaches the rounded edges of the wafer 300 which, as shown, is located slightly below the tip 120. As shown in FIG. 3(b), when the lower part of the wafer 300 is engaged by tip 200, the wafer is slightly lifted upward. Ultimately, the central plane of all of the rounded recesses 121 coincide with the central plane of the rounded edge of the wafer and this occurs concurrently at all three contact tips 120. FIG. 1 shows the apparatus.

The forefinger 110 can be designed to be closed or pursed to an opening having a width less than that of the inside of the cassette in which wafers 300 are stacked. Furthermore, the thickness of the wafer contact tip 120 formed on both ends of forefinger 110 and central tip support pad 102 should be less than the pitch between wafers 300 stacked in a cassette so that each wafer 300 stored in the cassette can be exchanged therein without difficulty.

On the support 100 wafer loading stopper 103 and release stopper 104 are formed so as to limit movement of forefingers 110 to prevent excessive opening or pursing (closing). Photodetector 160 is a detecting component of the present apparatus and is mounted on one side of support 100 in order to detect the presence of the light which, in turn, is determined by the positions of operating lever 113 of forefingers 110. In operation of forefingers 110 of the holding component, it is possible to detect the presence of the light even though one forefinger 110 is committed to hold the wafer while the other forefinger 110 is fixed.

Figure 5:
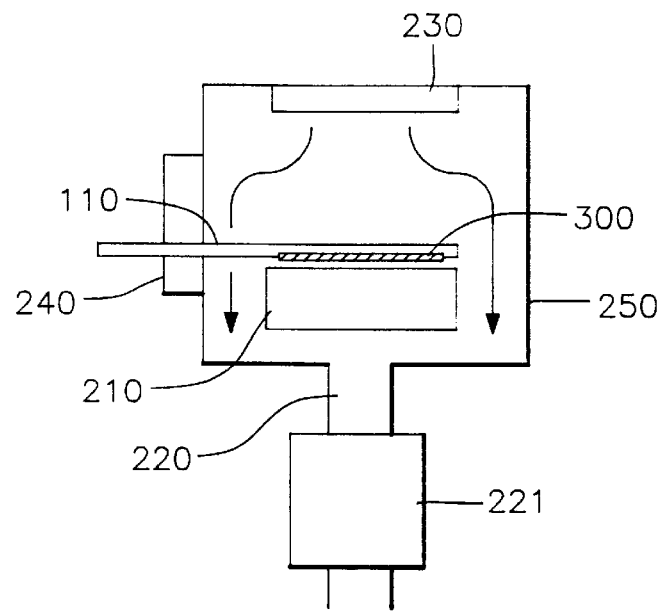
FIG. 5 is a sectional view of a process module which employs the wafer holder in accordance with the present invention.

In any case, it is noted, as shown in FIG. 5, that the structure of the process module in accordance with the present invention is simplified because the tripod 4 and tripod driving elements used in the conventional art are not necessary any more. Therefore, as will be understood, vacuum exhaust port 220 and vacuum pump 221 can be installed under wafer chuck 210 instead of the elements such as the tripod 4 and tripod driving elements which results in an increase of the process uniformity due to an axially-symmetric fluctuation of reaction gas applied from gas shower 230. Reference numbers 240 and 250 denote a gate valve and a chamber wall, respectively.

With the above construction of the wafer transferring apparatus of the present invention, the operation and its further advantages are apparent from the following descriptions. There are several steps for a transfer sequence in the apparatus in accordance with the present invention.

Figure 6A:
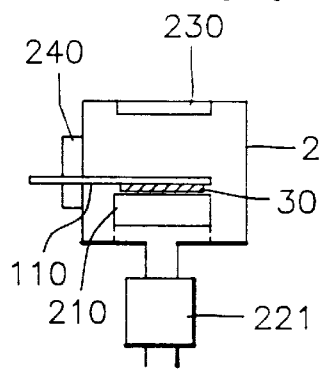
FIGS. 6a, 6b and 6c are schematic diagrams illustrating the procedures for loading and unloading a wafer using a wafer holder in accordance with the present invention.
Figure 6B:
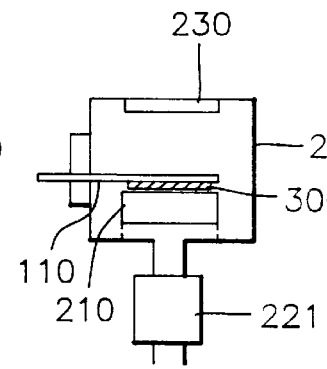
Figure 6C:
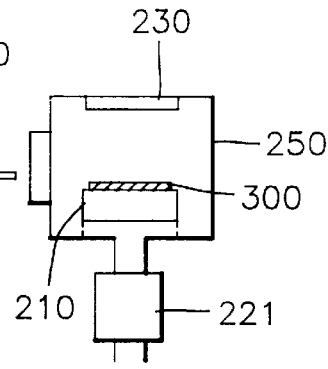

Referring to FIG. 6 which shows the sequence of three steps for the transfer of wafer 300 to wafer chuck 210 in that this can be achieved, there is no need of the tripod 4 in carrying wafer 300 in and out of the wafer chuck 210 in that this can be achieved by means of maintaining a small gap between wafer 300 and the surface of the wafer chuck 210. This gap is provided when forefingers 110 suspending the round edges of wafer 300 reach the center position of the reactor. This small gap can be adjusted by using the central robot shown in FIG. 9.

To fetch wafer 300 from a cassette during wafer transfer, forefingers 110 must be admitted into the inside of a cassette which is storing wafers. For the sake of that, as shown in FIG. 7, forefingers 110 are designed to have the thickness "h" which is less than the pitch between wafers stacked in the cassette and to have a maximum opening width "w" which is less than the width of the inside of the cassette. While wafer 300 is being transferred from the cassette, the upper or top surface of wafer contact tips 120 contact the underside of wafer 300, as shown in FIG. 7. Additionally, a rotation angle of wafer 300 is adjusted by an alignment adjuster, so that the straight flat surface 301 of wafer 300 can fit into the frame of wafer chuck 210.

Next, in order to load wafer 300 on wafer chuck 210 without use of additional tools, forefingers 110 of FIG. 8 are moved near the wafer which is still standing on the alignment adjuster and then rounded recesses 121 adjacent to the three tips 120 grasp the round edge portions of wafer 300 as shown in FIGS. 1 and 5.

It can be assumed that, as in other embodiments according to present invention, if wafer tip 120 on the central tip support pad 102 is rectangular or there are two wafer contact tips 120, wafer 300 may be grasped by using the compatible alignment angle.

When the holder driving mover 132 becomes more distant from operating hook 112 of forefingers 110, the forefingers 110 are pursed while rotating around roller bearing 111 by means of tension spring 150. On the contrary, forefingers 110 become open when holder driving mover 132 pushes the operating hook 112. At that time, in the case that there is no wafer to hold or wafer 300 cannot be grasped due to a staggered distortion of the forefinger 110, this will be detected as a fault or malfunction by photodetector 160 provided on support 100. More specifically, when the two forefingers 110 fail to hold the wafer 300, the operating level 113 will not block the light from a photo diode or other light source (not shown), disposed, e.g., adjacent to photo detector 160 and accordingly, the photo detector 160 will not receive light reflected from the operating level 113.

Wafer 300, which is suspended on the three recesses is then transferred to the center region over wafer chuck 210 in the process module by a robot as shown in FIG. 6. The holder driving mover's rotation to the left by virtue of holder driver 130 makes forefingers 110 open whereby wafer 300 is located at the center space of the reactor, being released from wafer contact tips 120. The steps for returning wafer 300 treated in the process reactor to the cassette for storage are the reverse of those (as described above) for loading wafer 300 on wafer chuck 210.

Figure 4B:
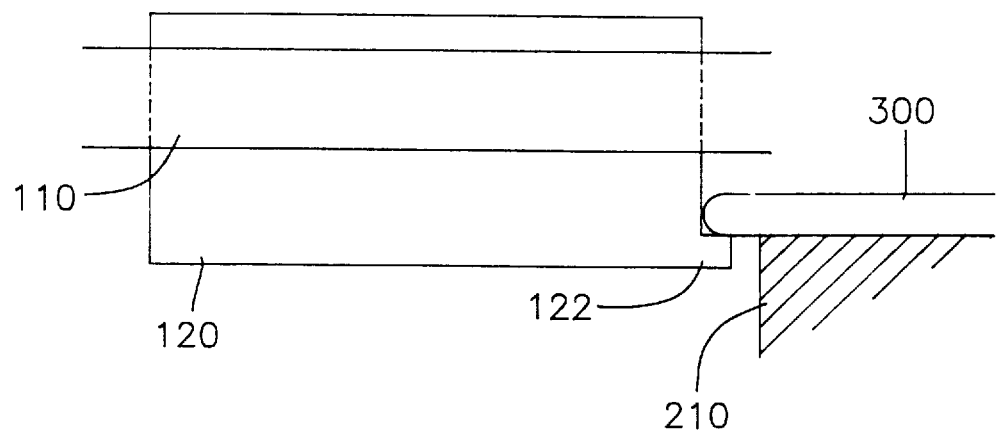

On the other hand, various modifications of wafer contact tips 120 may be used in the present invention. One modification involves holding the round edges of the wafer 300 by means of frictional force instead of using rounded recesses 121 shown in FIG. 3. This modification may be adaptable to the case where there is no problem in the process uniformity even though the size of wafer chuck 210 is smaller than that of wafer 300, which case is well illustrated in FIG. 4*b*. Referring to FIG. 4*b*, holder jaw 122 formed on wafer contact tips 120 can hold the outer underside of wafer 300 and the wafer 300 can be laid on, or lifted from, the wafer chuck 210 without the assistance of tools such as the tripod 4 et al. It may be possible for forefingers 110 to be made of two fingers, one of which is fixed and the other of which is movable. Furthermore, wafer contact tips 120 may be changed to the rectangular-type from the rounded configuration so that the wafer 300 can be grasped by the forefingers 110 having the rectangular-type tips simultaneously with the straight flat surface 300 being aligned in an acceptable position for manufacture, as shown in FIG. 5.

In conclusion, the present wafer transfer apparatus capable of holding the side of a wafer 300 allows the manufacturing process for semiconductor devices to be conducted without additional tools such as a tripod 4. Removal of the tripod 4 simplifies the overall structure of the present apparatus and there is no potential for leakage of reacting gas from the sealed portion with O-shaped ring 5 interposed between the process reactor and the tripod 4, as can occur in the conventional art. Thus, the uniformity during a manufacturing process would be secured thereby. The vacuum pump under the reactor enhances not only the process uniformity by producing an axially-symmetric flow of processing gas, but also enhances the exhaust speed of used gas. It should also be noted that the apparatus in accordance with the present invention may be useful in a wafer holding mechanism, assuming that an inhalation force cannot be used in a vacuum system. With a view to integrating the manufacturing apparatus for semiconductor products, since several process reactors (four to six) can share one wafer transfer apparatus, the present invention may be good for an application with the integrated system.

What is claimed is:

1. An apparatus for transferring a wafer, having rounded edges, said apparatus comprising:
   a gripping and transferring means for gripping and transferring a wafer to and from a wafer chuck without additional tools further comprising:
      holding means for holding the rounded edges of the wafer;
      means for actuating said holding means; and
      means for detecting a malfunction of said holding means; and
   a process reactor having a vacuum exhaust port installed under said wafer chuck so as to establish an axis-symmetrical flow.

2. An apparatus according to claim 1, wherein said holding means comprises forefingers opened and closed by means of said actuating means, and wafer contact tips formed on free ends of said forefingers and on a center tip support.

3. An apparatus according to claim 2, wherein one of said forefingers is fixed and a further of said forefingers is movable.

4. An apparatus according to claim 3, wherein a roller bearing for said holding means is attached to said further forefinger.

5. An apparatus according to claim 2, wherein said wafer contact tips include rounded recesses for holding the rounded edges of the wafer.

6. An apparatus according to claim 5, wherein said rounded recesses are provided in lower portions of said contact tips.

7. An apparatus according to claim 6, wherein contact tips are disposed such that said rounded recesses initially make contact with a lower portion of the rounded edges of the wafer so as to provide a slight lifting of the wafer.

8. An apparatus according to claim 2, where said wafer contact tips include a holding projection for engaging an outer bottom surface of the wafer adjacent to a rounded edge.

9. An apparatus according to claim 2, wherein said wafer contact tips have rectangular shapes so that the wafer is caught by said forefingers simultaneously with a flat orientation of the wafer in alignment with an adaptable position for processing.

10. An apparatus according to claim 2, wherein an opening width of said forefingers is less than that of the inside of a cassette for storing wafers and a thickness of said wafer contact tip is less than the pitch between wafers stacked in the cassette.

11. An apparatus according to claim 2, wherein said center tip support includes a wafer loading stopper and release stopper to prevent said forefingers from being opened and closed an excessive amount.

12. An apparatus according to claim 2, wherein one of said forefingers includes an operating lever movable to an operative position when a wafer is held by said forefingers and said detecting means comprises a photodetector for receiving an amount of light determined by whether said operating lever of said one forefinger is in said operative position.

13. An apparatus according to claim 2, wherein said actuating means comprises a holder driver, a holder driving mover operable in a rectilinear motion by a load of said holder driver, a compression spring inserted into said load, and a tension spring connected to an operating lever of said forefingers.

14. An apparatus according to claim 13, wherein said holder driver comprises a solenoid.

15. An apparatus according to claim 1, wherein the vacuum exhaust port and a vacuum pump are disposed under said wafer chuck and said wafer chuck is located in the reactor.

\* \* \* \* \*